United States Patent
Paul

(10) Patent No.: US 9,325,327 B1
(45) Date of Patent: Apr. 26, 2016

(54) CIRCUITS AND METHOD OF EQUALIZING IMPEDANCES OF PMOS AND NMOS DEVICES

(71) Applicant: Texas Instruments Incorporated, Dallas, TX (US)

(72) Inventor: Sabu Paul, Cochin (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/559,369

(22) Filed: Dec. 3, 2014

(51) Int. Cl.
*H03M 1/38* (2006.01)
*H03L 5/00* (2006.01)
*H03K 19/0944* (2006.01)
*H03K 19/0185* (2006.01)

(52) U.S. Cl.
CPC .......... *H03L 5/00* (2013.01); *H03K 19/018514* (2013.01); *H03K 19/0944* (2013.01); *H03M 1/38* (2013.01)

(58) Field of Classification Search
CPC ............. H03L 5/00; H03K 19/018514; H03K 19/0944; H03M 1/38
USPC .......... 341/118, 120, 155, 144, 163, 172, 161
See application file for complete search history.

(56) References Cited

U.S. PATENT DOCUMENTS

| | | | | |
|---|---|---|---|---|
| 5,283,535 A | * | 2/1994 | Sevenhans | H03F 1/3211 330/253 |
| 9,092,044 B2 | * | 7/2015 | Van Tran | G05F 3/30 |
| 2002/0060636 A1 | * | 5/2002 | Kazuhiro | G09G 3/3688 341/150 |
| 2005/0280468 A1 | * | 12/2005 | Song | H03F 1/301 330/264 |
| 2014/0035665 A1 | * | 2/2014 | Nicollini | H03F 3/3028 327/552 |
| 2014/0354308 A1 | * | 12/2014 | Hong | G01K 7/22 324/713 |

* cited by examiner

*Primary Examiner* — Peguy Jean Pierre
(74) *Attorney, Agent, or Firm* — Gregory J. Albin; Frank D. Cimino

(57) ABSTRACT

A circuit for equalizing the impedances of a PMOS device with an NMOS device includes a first reference voltage coupled to the source of the first PMOS device. A second reference voltage is coupled to the source of the NMOS device. A first node has a common mode voltage between the first reference voltage and the second reference voltage. A second node is located between the PMOS device and the NMOS device. A first gate voltage is coupled to the gate of either the PMOS device or the NMOS device. An operational amplifier has a first input coupled to the first node and a second input coupled to the second node, the output of the operational amplifier is a second gate voltage that is coupled to the gate of one of either the PMOS device or the NMOS device that is not coupled to the first gate voltage.

20 Claims, 3 Drawing Sheets

CIRCUITS AND METHOD OF EQUALIZING IMPEDANCES OF PMOS AND NMOS DEVICES

BACKGROUND

Some analog-to-digital converters (ADC) have a successive approximation register (SAR) topology. These converters work by comparing an analog voltage signal to known fractions of the full-scale input voltage and then setting or clearing bits in the ADC's data register. Some SAR converters use a capacitive digital-to-analog converter (C-DAC) to successively compare bit combinations. For example, the first bit is based on a comparison of half the full-scale input voltage to the input voltage. In response to the first comparison, the second bit is based on a comparison of either one quarter or three quarters of the full-scale input voltage.

Charge kickback occurs when the comparator is released from a reset condition and it is about to make a decision as to whether the voltage at the inverting input or the non-inverting input is greater. Just after the comparator is released from reset and depending on the speed of the comparator, it kicks a large amount of charge into the top plates of the capacitors. Some capacitors are coupled to positive metal oxide semiconductors (PMOS), and other capacitors are coupled to negative metal oxide semiconductors (NMOS). The NMOS and PMOS devices have different impedances, which causes the capacitors to drain at different rates. The result is different voltages on the capacitors during voltage decay, which causes errors when the voltages on the capacitors are compared.

SUMMARY

This disclosure has various aspects. One aspect is a circuit for equalizing the impedances of a PMOS device with an NMOS device includes a first reference voltage coupled to the source of the first PMOS device. A second reference voltage is coupled to the source of the NMOS device. A first node has a common mode voltage between the first reference voltage and the second reference voltage. A second node is located between the PMOS device and the NMOS device. A first gate voltage is coupled to the gate of either the PMOS device or the NMOS device. An operational amplifier has a first input coupled to the first node and a second input coupled to the second node, the output of the operational amplifier is a second gate voltage that is coupled to the gate of one of either the PMOS device or the NMOS device that is not coupled to the first gate voltage.

The circuit may include a first impedance coupled between the first reference voltage and the first node. A second impedance may be coupled between the first node and the second reference voltage. The first impedance and the second impedance may be resistors. A third impedance may be coupled between the first PMOS device and the second node and a fourth impedance may be coupled between the second node and the first NMOS device. The third impedance and the fourth impedance may be resistors.

Another aspect of this disclosure is an electronic device having at least one second PMOS device and at least one second NMOS device, wherein the gate of the second PMOS device is coupled to one of either the first gate voltage or the second gate voltage when the second PMOS device is on and wherein the second NMOS device is coupled to the other of the first gate voltage or the second gate voltage when the second NMOS device is on. The device may be a successive accumulation register analog-to-digital converter wherein the second PMOS device and the second NMOS device are coupled to capacitors.

Another aspect of this disclosure is a level shifter that includes a first output having a logic high that is approximately the first gate voltage and a second output having a logic high that is approximately the second gate voltage. The level shifter may include an inverter coupled to the second output wherein the inverter has an output voltage that is the second gate voltage.

Another aspect of this disclosure is a method of equalizing the impedance of a PMOS device with the impedance of an NMOS device includes determining a common mode voltage at a first node between a first reference voltage and a second reference voltage. The voltage at a second node between the PMOS device and the NMOS device is determined. The PMOS device is coupled to the first reference voltage, and the NMOS device is coupled to the second reference voltage. The gate of either one of the PMOS device or the NMOS device is driven with a first gate voltage. The gate of the other of the PMOS device or the NMOS device that is not driven by the first gate voltage is driven with a second gate voltage so that the voltage at the first node is approximately equal to the voltage at the second node. The first node may be coupled to the first reference voltage source by way of a first resistor, and the first node may be coupled to the second reference voltage source by way of a second resistor. The voltage at the first node may be compared to the voltage at the second node using an operation amplifier having an output, wherein the output is the second gate voltage.

Another aspect of this disclosure is an analog-to-digital converter (ADC) having a successive approximation register (SAR) includes an input for receiving an analog signal and at least one first capacitor having a first node and a second node wherein the first node coupled to the input. A first PMOS device couples the second node of the at least one first capacitor to a first reference voltage. A first NMOS device couples the second node of the at least one first capacitor to a second reference voltage. A first gate voltage is for driving a gate of the first PMOS device and a second gate voltage is for driving a gate of the first NMOS device. The impedance of the first NMOS device when driven by the second gate voltage is substantially the same as the impedance of the first PMOS device when driven by the first gate voltage. The ADC may include a comparator having a first input and a second input, the first input is coupled to the first node of the capacitor and the second node is coupled to a predetermined voltage source.

Some features of the ADC may include a first component of the input, wherein the first component is coupled to the first node of the at least one first capacitor. A second component of the input may be coupled to the first node of at least one second capacitor having the first node and a second node. A second PMOS device may couple the second node of the at least one second capacitor to the first reference voltage and a second NMOS device may couple the second node of at least one second capacitor to the second reference voltage. The second gate voltage is for driving a gate of the second NMOS device and the first gate voltage for driving a gate of the second PMOS device. The impedance of the second NMOS device when driven by the second gate voltage may be substantially the same as the impedance of the second PMOS device when driven by the first gate voltage.

Other features of the ADC may include a comparator having a first input and a second input wherein the first input is coupled to the first node of the at least one first capacitor and the second node is coupled to the first node of the at least one second capacitor. The comparator may be a latch-only comparator.

Other features of the ADC may include circuitry for generating the second gate voltage. The circuitry may include a third PMOS device coupled to the first reference voltage wherein the gate of the third PMOS device is coupled to the first gate voltage. A third NMOS device may be coupled to the second reference voltage wherein the gate of the third NMOS device is coupled to the second gate voltage. A first node has a voltage between the first reference voltage and the second reference voltage. A second node is located between the third PMOS device and the third NMOS device. An operational amplifier has a first input coupled to the first node and a second input coupled to the second node. The output of the operational amplifier is the second gate voltage. The first node may be coupled to the first reference voltage by a first resistor and the first node may be coupled to the second reference voltage by a second resistor, wherein the first resistor and the second resistor have substantially the same value.

Another aspect of this disclosure is circuitry for generating the first gate voltage. The circuitry includes a third PMOS device coupled to the first reference voltage, the gate of the third PMOS device is coupled to the first gate voltage. A third NMOS device is coupled to the second reference voltage. The gate of the third NMOS device is coupled to the second gate voltage. A first node has a voltage between the first reference voltage and the second reference voltage and a second node is located between the third PMOS device and the third NMOS device. An operational amplifier may have a first input coupled to the common mode voltage and a second input coupled to the node, with the output of the operational amplifier being the first gate voltage.

DETAILED DESCRIPTION

Figure 1:
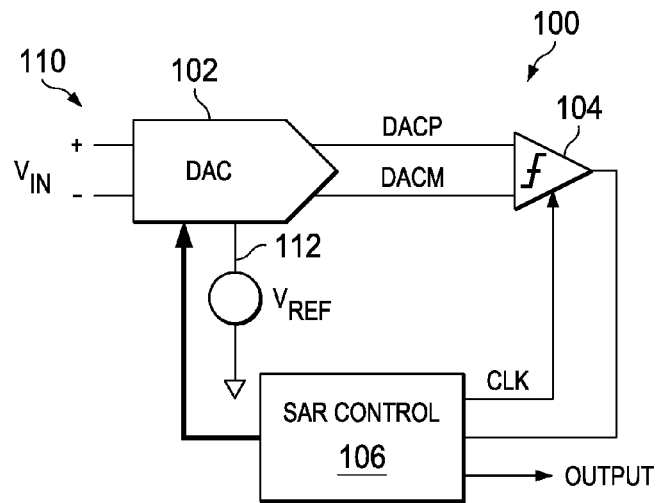
FIG. 1 is a block diagram of an embodiment of a SAR loop used with a DAC.

Circuits and method for equalizing the impedances of PMOS and NMOS devices are described herein with reference to successive approximation registers (SARs) integrated with digital to analog converters (DACs). FIG. 1 is a block diagram of an embodiment of a SAR loop 100 integrated with a DAC 102. In addition to the DAC 102, the SAR loop 100 includes a comparator 104 and a SAR control 106. The DAC 102 has an input 110 that is coupled to or is able to be coupled to an input voltage $V_{IN}$ that is to be converted to a digital signal. In some aspects of the SAR loop 100, the DAC 102 also has an input 112 that is coupled to or able to be coupled to a reference voltage $V_{REF}$. In some aspects, the reference voltage $V_{REF}$ is generated internal to the DAC 102. The DAC 102 is sometimes referred to as a capacitive DAC or C-DAC.

The comparator 104, in summary, compares the input voltage $V_{IN}$ to a voltage selected by the SAR control 106. In some versions of the SAR loop 100, the comparator 104 is a latch-only comparator. The output of the comparator 104 is coupled to the SAR control 106, wherein the output of the comparator 104 determines the bits of the output digital signal. The SAR control 106, in summary, controls the voltages compared by the comparator 104 based on the outcome of a previous comparison. For example, in a first comparison, the SAR control 106 causes the input voltage $V_{IN}$ to be compared to half of a full-scale input. The full-scale input in some of the aspects described herein is the reference voltage $V_{REF}$, which may also be a supply voltage for the SAR loop 100. If the comparator 104 indicates that the input voltage $V_{IN}$ is greater than the half full-scale input, the SAR control 106 causes the DAC 102 to output three fourths of the full-scale input for the second comparison to the input voltage. However, if the comparator 104 indicates that the input voltage is less than the half full-scale input, the SAR control 106 causes the DAC 102 to output one quarter of the full-scale input voltage for the next comparison. The result of each comparison determines a bit of the output digital signal. The comparisons continue until a predetermined number of comparisons have been completed, wherein the number of comparisons represents the accuracy of the SAR loop 100.

Figure 2:
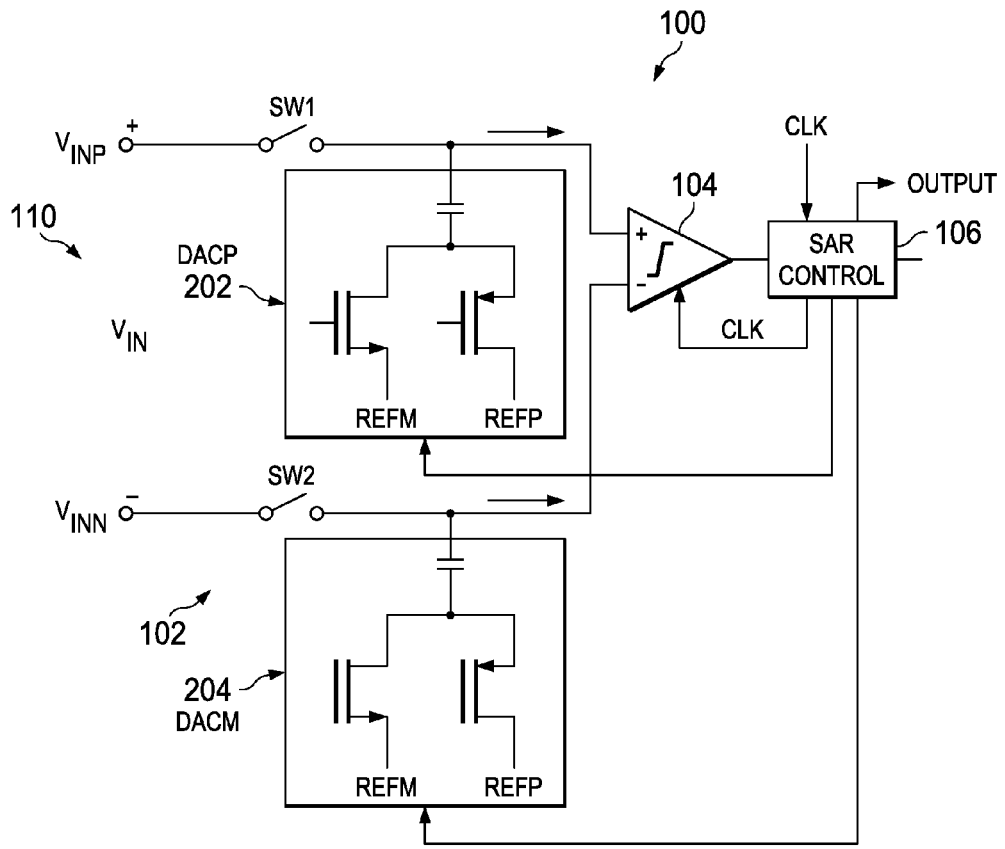
FIG. 2 is a more detailed diagram of the SAR loop of FIG. 1.

Having summarily described the SAR loop 100, it will now be described in greater detail. Additional reference is made to FIG. 2, which is a more detailed diagram of the SAR loop 100 of FIG. 1. The DAC 102 of FIG. 2 has a differential input 110 that is coupled to the input voltage $V_{IN}$. The differential input voltage $V_{IN}$ includes a positive component $V_{INP}$ and a negative component $V_{INN}$. The input 110 is coupled to switches SW1 and SW2. In the DAC 102 of FIG. 2, the switches SW1 and SW2 open and close together at the sampling frequency of the DAC 102.

The DAC 102 is a differential DAC having a positive section 202, which is sometimes referred to as DACP and a negative section 204, which is sometimes referred to as DACM. The positive section 202 is coupled to the non-inverting input of the comparator 104 and the negative section 204 is coupled to the inverting input of the comparator 104. In the embodiments described herein, the DAC 102 uses a capacitor array to select voltages to be compared by the comparator 104, wherein the SAR control 106 selects the capacitors in the array that are to be charged for voltage sampling. The capacitors are described as having top plates and bottom plates. The top plates of the capacitors in the positive section 202 and the negative section 204 are the nodes of the capacitors that are coupled to the comparator 104. The bottom plates are the nodes that are coupled to switches that select the individual capacitors that are to be coupled to the comparator 104 by way of reference voltages described further below. The switches are metal oxide semiconductor (MOS) devices, such as field effect transistors (FETs).

The comparator 104 compares the input from the positive section 202 to the input from the negative section 204 and outputs a signal indicating which one is greater. In response to that signal, the SAR control 106 outputs signals that set switches connected to the bottom plates of the capacitors to select or deselect certain capacitors from the next sampling. The successive samplings yield the lesser significant bits of the digital signal representative of the analog input voltage $V_{IN}$.

As described in greater detail below, the switches couple the bottom plates of the capacitors to either one of two voltage sources, with are referred to as the positive source REFP and the negative source REFM. In the embodiments described herein, positive metal oxide semiconductor (PMOS) devices, such as p-channel field effect transistors (PFETs), couple the bottom plates of the capacitors to the positive reference voltage REFP. Negative metal oxide semiconductor (NMOS) devices, such as n-channel field effect transistors (NFETs), couple the bottom plates of the capacitors to the negative reference voltage REFM. The PMOS devices have different source/drain impedances than the NMOS devices.

Charge kickback occurs when the comparator 104 is released from a reset condition and it is about to make a decision as to whether the voltage at the inverting input or the non-inverting input is greater. Just after the comparator 104 is released from reset and depending on the speed of the comparator 104, it kicks a charge into the top plates (plates coupled to the comparator 104) of the capacitors. This kickback has to settle or decay in a manner independent of the input voltage $V_{IN}$, but dependent on the impedances of the NMOS devices and the PMOS devices. The above-described difference in impedances between NMOS and PMOS devices can cause the differential input to the comparator 104 to be erroneous just prior to the comparator 104 making its decision. This error at the differential input causes the output of the comparator 104 to be erroneous, which causes the digital signal generated by the SAR loop 100 to be incorrect. The circuits and methods described herein equalize the impedances on the PMOS and NMOS devices so that the voltage decays on the capacitors are substantially equal, which results in cancellation of the effects of charge kickback.

Figure 3:
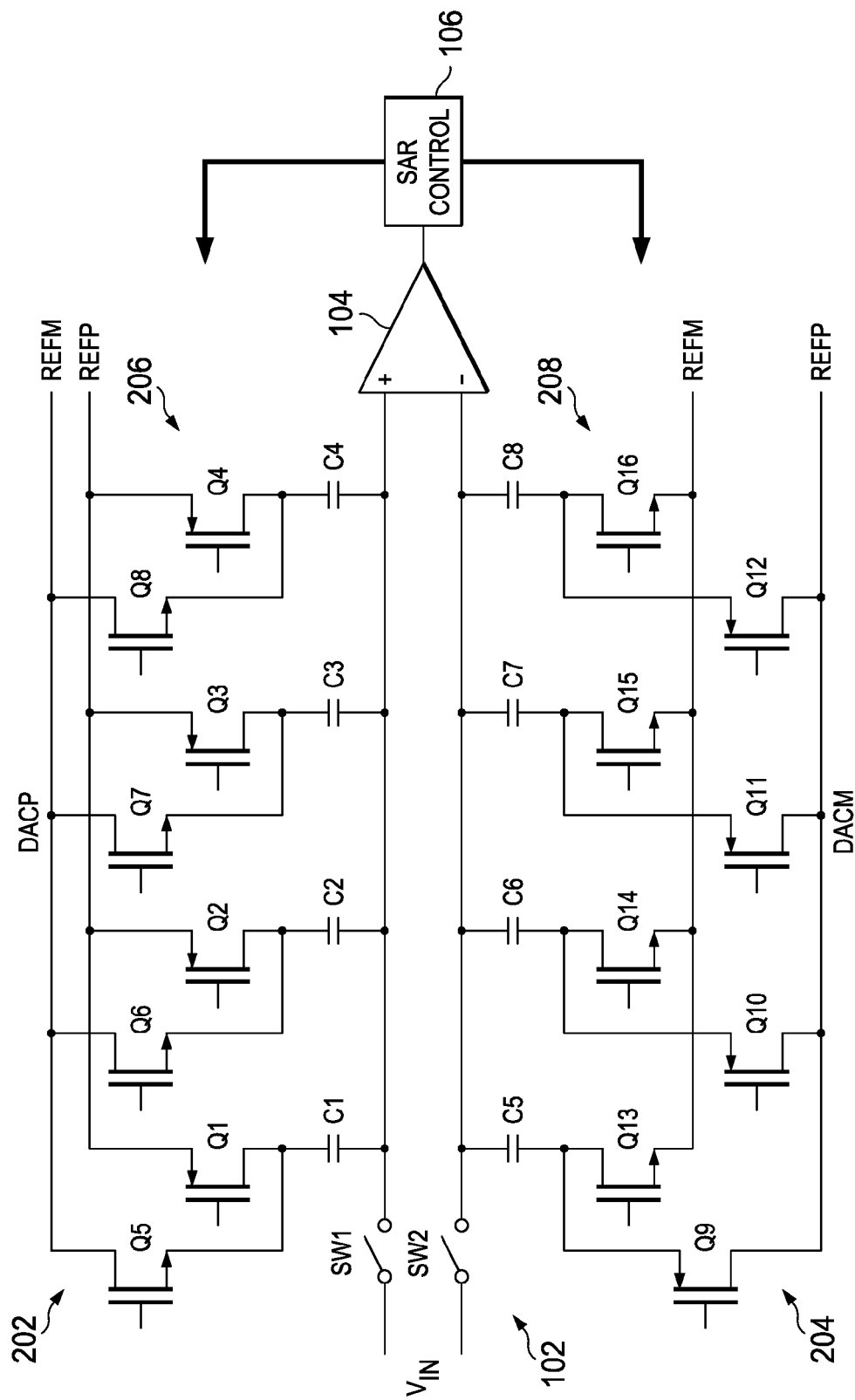
FIG. 3 is a diagram of a simplified DAC used in the SAR loop of FIG. 1.

Reference is made to FIG. 3, which is a diagram of a simplified DAC 102 used in the SAR loop of FIG. 1. The positive section 202 has a plurality of capacitors C1-C4 coupled to FETs 206 that couple the capacitors to reference voltages REFP and REFM. In other embodiments, other MOS devices may be used in place of the FETs 206. FETs Q1-Q4 are p-channel FETs that couple the capacitors C1-C4 to the positive reference voltage REFP. FETs Q5-Q8 are n-channel FETs that couple the capacitors C1-C4 to the negative reference voltage REFM. In some versions of the DAC 102, the reference voltages REFP and REFM are derived from the reference voltage $V_{REF}$ of FIG. 1. In some versions of the DAC 102, both reference voltages REFP and REFM are referenced to a ground. The reference voltage REFP is greater than the reference voltage REFM and the reference voltage REFM may or may not be negative in reference to a ground.

The negative section 204 has the same number of capacitors as the positive section 202, which are referred to as the capacitors C5-C8. As with the positive section 202, a plurality of FETs 208 couples the capacitors C5-C8 to the reference voltages REFP and REFM. FETs Q9-Q12 couple the capacitors C5-C8 to the positive reference voltage REFP and FETs Q13-Q16 couple the capacitors C5-C8 to the negative reference voltage REFM. The number of capacitors in the DAC 102 is proportional to the number of bits of accuracy that can be achieved by the SAR loop 100.

The top plates of the capacitors C1-C4 are coupled to the non-inverting input of the comparator 104 and the top plates of the capacitors C5-C8 are coupled to the inverting input of the comparator 104. The bottom plates of the capacitors C1-C8 are coupled to both n-channel FETs and p-channel FETs to couple them to either the positive reference voltage REFP or the negative reference voltage REFM. Only one FET at a time is coupled to each capacitor, so only one of the FETs coupled to each capacitor will be on at any given time. For example, either the FET Q1 or the FET Q5 will be on during a specific period; both will not be on at the same time. The status of the FETs are controlled by the SAR control 106 as described below and as known by those skilled in the art of SAR DACs. For example, the SAR control 106 controls the gate voltages of the FETs to determine which FETs are on (conducting) and which FETs are off (not conducting).

The DAC 102 is susceptible to charge kickback from a latch or similar device in the comparator 104. The charge kickback is caused by a sudden removal of charge from the top plate of one or more of the capacitors C1-C8 when the comparator 104 is released from a reset mode. The charge kickback from the comparator 104 into the top plates of the capacitors C1-C8 settles or decays according to the impedances of the FETs Q1-Q16 associated with the capacitors C1-C8. One of the problems with the charge kickback is that the drain/source impedances of the NMOS devices (the n-channel FETs) differ from the drain/source impedances of the PMOS devices (the p-channel FETs). The result is that the voltage decay on the capacitors C1-C8 are not the same, especially when many of one type of MOS device and few of the other type of MOS device are coupled to the capacitors C1-C8.

Figure 4:
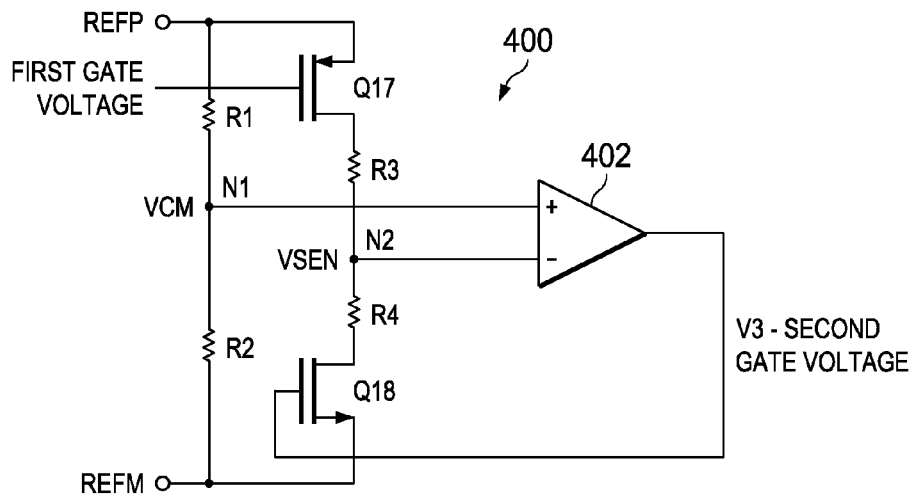
FIG. 4 is an embodiment of a circuit for determining the gate voltage required for balancing the impedances of the NMOS and PMOS devices of FIG. 3.

In order to equalize the impedances of the FETs 206, 208, the gate voltages of the n-channel FETs are adjusted so that their drain/source impedances are matched to the drain/source impedances of the p-channel FETs. It is noted that the gate voltages of the PMOS devices could be adjusted instead of or in addition to the NMOS devices. A circuit 400 for determining the gate voltage required for equalizing the impedances of the N-channel FETs and P-channel FETs is shown in FIG. 4. The circuit 400 includes inputs for the reference voltages REFP and REFM, which are coupled together at a node N1 by way of two resistors R1 and R2. In some aspects of the circuit 400, the values of the resistors R1 and R2 are equal. The voltage at the node N1 is a common mode voltage referred to as $V_{CM}$, meaning that it is the midrange voltage between the reference voltages REFP and REFM.

The reference voltages REFP and REFM are also connected to two FETs Q17 and Q18. The FET Q17 is a p-channel device similar or identical to the p-channel FETs in the DAC 102 of FIG. 3. The gate of the PET Q17 is driven by a first gate voltage, which in the version of FIG. 4 is a fixed voltage. The BET Q18 is an n-channel FET similar or identical to the n-channel FETs in the DAC 102. The gate of the FET Q18 is driven by a second gate voltage, which is determined to equalize the impedance of the PET Q18 with the impedance of the FET Q17. The FETs Q17 and Q18 may be located in close proximity to the FETs Q1-Q16 so that they are the same temperature as the FETs Q1-Q16. Resistors R3 and R4 couple the FETs Q17 and Q18, wherein the resistors R3 and R4 have the same values in the embodiment of FIG. 4. The junction of the resistors R3 and R4 is a node N2 having a potential referred to as the sensing voltage $V_{SEN}$. If the impedances of the FETs Q17 and Q18 are equal, then the values of the voltages $V_{CM}$ and $V_{SEN}$ will be equal. However, NMOS devices and PMOS devices typically have different impedances, so the common mode voltage $V_{CM}$ typically will not equal the sensing voltage $V_{SEN}$ unless the gate voltages of the FETs Q17 and Q18 are different.

An operational amplifier, compares the sensing voltage $V_{SEN}$ to the common mode voltage $V_{CM}$ and outputs a voltage V3, which is the second gate voltage, that drives the gate of the FET Q18 so that the sensing voltage $V_{SEN}$ equals the common mode voltage $V_{CM}$. When this occurs, the impedance of the p-channel FET Q17 is equal to the impedance of the n-channel FET Q18. The second gate voltage V3 is used as a driver or a reference voltage for a driver for the gates of the n-channel FETs in the DAC 102, FIG. 3. More specifically, by using the second gate voltage V3 to drive the gates of the n-channel FETs in the DAC 102, the impedances of the p-channel FETs and the impedances of the n-channel FETs are equal. The result is that the effects of the charge kickback on the comparator 104 are eliminated or cancelled by the comparator 104 because the voltages caused by charge kickback on the inverting and non-inverting inputs are equal. In some versions, the first gate voltage is applied to the gates of the NMOS devices and the second gate voltage is applied to the gates of the PMOS devices.

Figure 5:
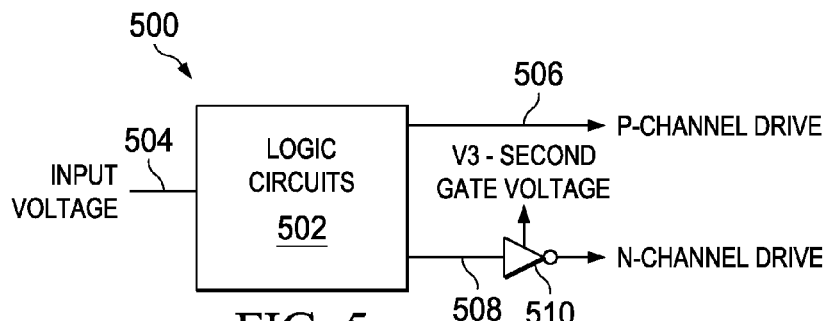
FIG. 5 is an embodiment of a level shifter used to drive the gate voltages of the NMOS devices of FIG. 3.

Additional reference is made to FIG. 5, which is an embodiment of a level shifter 500 used to drive the FETs of the DAC 102. The level shifter 500 includes logic circuits 502 having an input 504, a p-channel output 506 and an n-channel output 508. The input 504 is coupled to a voltage source. In some versions of the level shifter 500, the input 504 is coupled to the SAR output from the SAR control 106, which drives the gates of the FETs Q1-Q16. In some versions of the level shifter 500, the logic circuits 502 functions as conventional logic circuits coupled between a SAR control and switching devices. The level shifter 500 of FIG. 5 includes an inverter 510 that is coupled to the output 508. The inverter 510 is powered by the second gate voltage V3 or is otherwise configured so that the high output voltage is limited to the second gate voltage V3. In some embodiments, the level shifter 500 functions by outputting the voltage from the SAR control 106 to selected p-channel FETs and the second gate voltage V3 to selected n-channel FETs. Accordingly, the gate driving voltages of the NMOS devices are different from the gate driving voltages of the PMOS voltages so that the impedances of the NMOS devices match the impedances of the PMOS devices.

Having described the components of the SAR loop 100, its operation will now be described. More specifically, the operation of the DAC 102 will be described. The impedances of FETs changes over time and with variables, such as temperature. In order to determine the proper gate voltage to be applied to equalize or balance the impedances of the n-channel FBI's with the p-channel FETs, the circuit 400 of FIG. 4 generates the second gate voltage V3. In some aspects of the SAR loop, FIG. 1, the circuit 400 is physically located proximate the DAC 102 so that the FETs Q17 and Q18 have the same temperatures and other characteristics as the FETs Q1-Q16. The operational amplifier 402 outputs the second gate voltage V3 in order to maintain the common mode voltage $V_{CM}$ equal to the sensing voltage $V_{SEN}$. Because of the configuration of the FETs Q17 and Q18, the output voltage V3 is the voltage applied to the gate of the FET Q18 that causes its impedance to be the same as the impedance of the FET Q17. The second gate voltage V3 drives the gates of the n-channel FETs in the DAC 102 when they are turned on. In some embodiments, the level shifter 500 is drives the gates of the FETs Q1-Q16 in the DAC 102. In a conventional SAR loops, the SAR output drives all the gates. However, the level shifter 500 has the inverter 510 that outputs the second gate voltage V3 to drive the gates of the n-channel FETs when they are turned on. The voltage of gates of the p-channel FETs is a conventional SAR output voltage, which is the first gate voltage.

During successive approximations of the input voltage $V_{IN}$, the SAR control 106 selects different capacitors C1-C8 to charge. During the charging process, selected ones of the capacitors C1-C4 in the positive section 202 are coupled to the positive reference voltage REFP and others are coupled to the negative reference voltage REFM. The capacitors C5-C8 in the negative section 204 are typically configured in the opposite configuration as the positive portion 204. Therefore, several capacitors may be coupled to the p-channel FETs and a few capacitors may be coupled to the n-channel FETs or vise versa. Because the second gate voltage V3 is the gate voltage of the n-channel FETs, the impedances of the n-channel FETs are equal to the impedances of the p-channel FETs. When a latch is released in the comparator 104, the voltage decay of the voltages on all the capacitors C1-C8 is equal regardless of whether the capacitors C1-C8 are coupled to n-channel FETs or p-channel FETs. Therefore, any common mode voltages cancel and do not cause a voltage difference on the input of the comparator 104. It follows that the output of the comparator 104 is more accurate than those used in conventional SAR loops.

The equalization of the impedances of PMOS and NMOS devices have been described above in relation to differential SAR DAC devices. The circuits and methods described herein are applicable to other devices, including single-ended SAR loops. For example, the circuits and methods described herein may be used in situations wherein the DAC has only one section and not both a DACP and a DACM. The number of FETs that are turned on depends on the input voltage, but there is still a kickback related voltage at the top plate that is dependent on the input voltage and this will cause non-linearity. By equalizing the impedances, both the NMOS and PMOS devices present the same impedance at their respective reference voltages.

Figure 6:
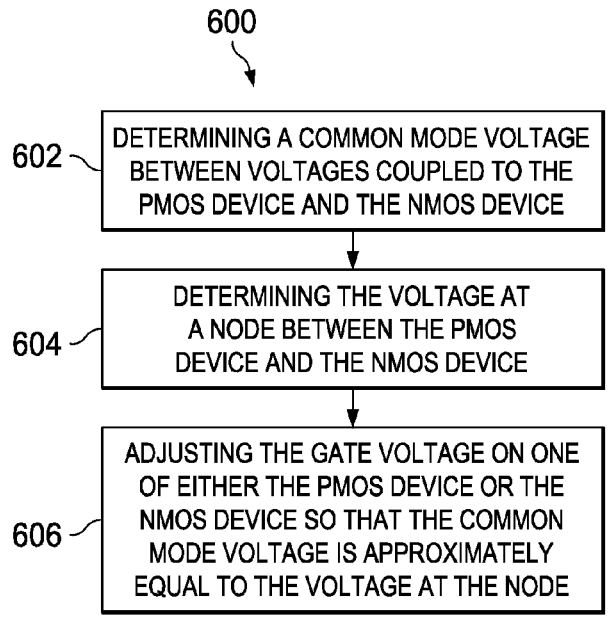
FIG. 6 is a flowchart describing a method for equalizing the impedances of a circuit having PMOS and NMOS devices.

The circuit 400 is generates the gate voltage for the FET Q18 in order to equalize the impedance of the FET Q17 with the FET Q18. The operation of the circuit 400 is described by the flowchart 600 of FIG. 6 as follows. At step 602 a common mode voltage between voltages coupled to the PMOS device and the NMOS device is determined. At step 604, a voltage at a node between the PMOS device and the NMOS device is determined. At step 606, the gate voltage on the FET Q18 device is adjusted so that the common mode voltage is approximately equal to the voltage at the node. It is noted that in some embodiments, the voltage on the gate of the FET Q17 is adjusted rather than the voltage on the gate of the FET Q18.

While illustrative and presently preferred embodiments of various aspects of the Application have been described in detail herein, it is to be understood that the inventive concepts may be otherwise variously embodied and employed and that the appended claims are intended to be construed to include such variations except insofar as limited by the prior art.

What is claimed is:

1. A circuit for equalizing the impedances of a first p-channel metal-oxide-semiconductor field-effect transistor (PMOS) device with a first n-channel metal-oxide-semiconductor field-effect transistor (NMOS) device, the circuit comprising:
   a first reference voltage coupled to a source of the first PMOS device;
   a second reference voltage coupled to a source of the first NMOS device;
   a first node having a common mode voltage between the first reference voltage and the second reference voltage;
   a second node located between the first PMOS device and the first NMOS device;
   a first gate voltage coupled to a gate of either the first PMOS device or the first NMOS device; and
   an operational amplifier having a first input coupled to the first node and a second input coupled to the second node, an output of the operational amplifier being a second gate voltage and coupled to a gate of one of either the first PMOS device or the first NMOS device that is not coupled to the first gate voltage.

2. The circuit of claim 1 further comprising:
   a first impedance coupled between the first reference voltage and the first node; and a second impedance coupled between the first node and the second reference voltage.

3. The circuit of claim 2, wherein the first impedance and the second impedance are resistors.

4. The circuit of claim 1 further comprising:
a third impedance coupled between the first PMOS device and the second node; and
a fourth impedance coupled between the second node and the first NMOS device.

5. The circuit of claim 4, wherein the third impedance and the fourth impedance are resistors.

6. The circuit of claim 1 further comprising an electronic device having at least one second PMOS device and at least one second NMOS device, wherein a gate of the second PMOS device is coupled to one of either the first gate voltage or the second gate voltage when the second PMOS device is on and wherein the second NMOS device is coupled to the other of the first gate voltage or the second gate voltage when the second NMOS device is on.

7. The circuit of claim 6 wherein the device is a successive approximation register analog-to-digital converter and wherein the second PMOS device and the second NMOS device are coupled to capacitors.

8. The circuit of claim 1, further comprising a level shifter, the level shifter comprising:
a first output having a logic high that is approximately the first gate voltage; and
a second output having a logic high that is approximately the second gate voltage.

9. The circuit of claim 8 further comprising an inverter coupled to the second output, the inverter having an output voltage that is the second gate voltage.

10. A method of equalizing the impedance of a p-channel metal-oxide-semiconductor field-effect transistor (PMOS) device with the impedance of an n-channel metal-oxide-semiconductor field-effect transistor (NMOS) device, the method comprising:
determining a common mode voltage at a first node between a first reference voltage and a second reference voltage;
determining a voltage at a second node between the PMOS device and the NMOS device, the PMOS device being coupled to the first reference voltage, and the NMOS device being coupled to the second reference voltage;
driving a gate of either one of the PMOS device or the NMOS device with a first gate voltage; and
driving a gate of the other of the PMOS device or the NMOS device that is not driven by the first gate voltage with a second gate voltage so that a voltage at the first node is approximately equal to the voltage at the second node.

11. The method of claim 10, wherein the first node is coupled to the first reference voltage source by way of a first resistor, and wherein the first node is coupled to the second reference voltage source by way of a second resistor.

12. The method of claim 10 further comprising comparing the voltage at the first node to the voltage at the second node using an operational amplifier having an output, wherein the output is the second gate voltage.

13. An analog-to-digital converter (ADC) having a successive approximation register (SAR) comprising:
an input for receiving an analog signal;
at least one first capacitor having a first node and a second node, the first node coupled to the input;
a first p-channel metal-oxide-semiconductor field-effect transistor (PMOS) device coupling the second node of the at least one first capacitor to a first reference voltage;
a first n-channel metal-oxide-semiconductor field-effect transistor (NMOS) device coupling the second node of the at least one first capacitor to a second reference voltage;
a first gate voltage for driving a gate of the first PMOS device; and
a second gate voltage for driving a gate of the first NMOS device;
wherein an impedance of the first NMOS device when driven by the second gate voltage is substantially the same as an impedance of the first PMOS device when driven by the first gate voltage.

14. The ADC of claim 13 further comprising a comparator having a first input and a second input, the first input being coupled to the first node of the at least one first capacitor, the second input being coupled to a predetermined voltage source.

15. The ADC of claim 13 further comprising:
a first component of the input, wherein the first component is coupled to the first node of the at least one first capacitor;
a second component of the input;
at least one second capacitor having a first node and a second node, the first node of the at least one second capacitor coupled to the second component of the input;
a second PMOS device coupling the second node of the at least one second capacitor to the first reference voltage; and
a second NMOS device coupling the second node of at least one second capacitor to the second reference voltage;
the second gate voltage for driving a gate of the second NMOS device; and
the first gate voltage for driving a gate of the second PMOS device;
wherein an impedance of the second NMOS device when driven by the second gate voltage is substantially the same as an impedance of the second PMOS device when driven by the first gate voltage.

16. The ADC of claim 15 further comprising a comparator having a first input and a second input, the first input being coupled to the first node of the at least one first capacitor and the second input being coupled to the first node of the at least one second capacitor.

17. The ADC of claim 16, wherein the comparator is a latch-only comparator.

18. The ADC of claim 13 further comprising circuitry for generating the second gate voltage, the circuitry comprising:
a second PMOS device coupled to the first reference voltage, the gate of the second PMOS device being coupled to the first gate voltage;
a second NMOS device coupled to the second reference voltage, the gate of the second NMOS device being coupled to the second gate voltage;
a third node having a voltage between the first reference voltage and the second reference voltage;
a fourth node located between the second PMOS device and the second NMOS device;
an operational amplifier having a first input coupled to the third node and a second input coupled to the fourth node, an output of the operational amplifier being the second gate voltage.

19. The ADC of claim 18 wherein the third node is coupled to the first reference voltage by a first resistor, and the third node is coupled to the second reference voltage by a second resistor, and wherein the first resistor and the second resistor have substantially the same value.

20. The ADC of claim 13 further comprising circuitry for generating the first gate voltage, the circuitry comprising:
- a second PMOS device coupled to the first reference voltage, the gate of the second PMOS device being coupled to the first gate voltage;
- a second NMOS device coupled to the second reference voltage, the gate of the second NMOS device being coupled to the second gate voltage;
- a third node having a voltage between the first reference voltage and the second reference voltage;
- a fourth node located between the second PMOS device and the second NMOS device;
- an operational amplifier having a first input coupled to the common mode voltage and a second input coupled to the third node, an output of the operational amplifier being the first gate voltage.

* * * * *